United States Patent [19]
Kownacki et al.

[11] Patent Number: 6,122,815
[45] Date of Patent: Sep. 26, 2000

[54] CIRCUIT BOARD STIFFENER AND METHOD OF ATTACHMENT TO A CIRCUIT BOARD

[75] Inventors: Charles D. Kownacki, Erie, Pa.; Paul M. Deters, Manhattan Beach, Calif.

[73] Assignee: Power Distribution Products, Torrance, Calif.

[21] Appl. No.: 09/067,376

[22] Filed: Apr. 27, 1998

[51] Int. Cl.[7] .............................. B23P 19/00; H05K 5/00
[52] U.S. Cl. .................. 29/426.1; 29/525.03; 29/525.04; 411/44; 411/71; 411/359; 403/408.1; 361/752; 174/255; 408/99
[58] Field of Search .......................... 29/525.03, 525.04, 29/525.06, 426.1, 426.5; 411/44, 71, 72, 359; 361/748, 749, 752; 174/255, 138 G; 403/408.1; 428/99

[56] References Cited

U.S. PATENT DOCUMENTS

| | | |
|---|---|---|
| 3,624,867 | 12/1971 | Reynolds . |
| 4,416,048 | 11/1983 | Otte ........................................ 29/525.06 |
| 4,452,359 | 6/1984 | Koppensteiner ............................ 211/41 |
| 4,533,978 | 8/1985 | Walter ...................................... 361/419 |
| 4,757,664 | 7/1988 | Freissle ................................... 29/525.1 |
| 4,863,597 | 9/1989 | Gilles et al. . |
| 4,988,577 | 1/1991 | Jamieson ................................... 428/573 |
| 5,065,490 | 11/1991 | Wivagg et al. .......................... 29/525.1 |
| 5,100,273 | 3/1992 | Vassiliou . |
| 5,136,470 | 8/1992 | Sheridon et al. ........................ 361/398 |
| 5,175,911 | 1/1993 | Terrels et al. . |
| 5,186,377 | 2/1993 | Rawson et al. ............................ 228/37 |
| 5,198,279 | 3/1993 | Beinhaur et al. .......................... 428/99 |
| 5,245,509 | 9/1993 | Seitz ........................................ 361/720 |
| 5,333,965 | 8/1994 | Mailey ................... 403/406.1 |
| 5,360,346 | 11/1994 | Regnier ...................................... 439/61 |
| 5,557,503 | 9/1996 | Isaacs et al. ............................ 361/719 |
| 5,816,413 | 10/1998 | Boccabella et al. . |
| 5,864,934 | 2/1999 | Young ................... 29/525.06 |

*Primary Examiner*—David P. Bryant
*Attorney, Agent, or Firm*—Richard K. Thomson

[57] ABSTRACT

A rigid bar of material is fastened to a circuit board to increase its stiffness. The bar is preferably a high modulus plastic such as liquid crystal polymer. Flexible fingers which surround a central opening are formed integrally with the bar and pop into throughbores in the circuit board. Each finger has at least one arcuate protrusion and, preferably several, which can engage the bottom of the circuit board. A rigid pin which may be made of steel is slid into the central opening and has an interference fit therewith to hold it in place to prevent flexible fingers from moving inwardly so the stiffener is held fast to the circuit board.

17 Claims, 2 Drawing Sheets

CIRCUIT BOARD STIFFENER AND METHOD OF ATTACHMENT TO A CIRCUIT BOARD

The present invention is directed to a stiffener for a circuit board. More particularly, the present invention is directed to an inexpensive board stiffener that can be quickly, easily and securely assembled to a circuit board and, in which access from only one side of the board is necessary.

BACKGROUND AND SUMMARY OF THE INVENTION

Circuit boards are typically rather thin and, therefore, flimsy. While this low profile is an advantage for meeting spacial limitations, it can be the source of problems arising from lack of structural stability. The thinness of the panel can make the board and its circuit connections vulnerable to shock and vibration that will damage or break the soldered connections. Further, the soldering process itself with its input of heat can result in board warpage that can make creation of proper connections difficult, if not impossible.

Various devices have been offered to stiffen a board. Many of these stiffeners are simply bolted to the board. Such fastening means requires access to both sides of the circuit board, which is not always available. Even where such access is available, such attachment requires hole alignment and fastener insertion, which can add time and, hence, expense to the assembly process. Many of the stiffeners are metallic so they are both electrically and thermally conductive. For certain applications, this can be undesirable. Some assembly techniques require deflection of some portion of an integral stiffener portion to create a fastener. Such mangling of the stiffener makes removal and replacement thereof, should such become desirable, extremely difficult and labor intensive and could result in damage to the board and/or its circuitry.

The present invention overcomes the difficulties with the prior art devices. A stiffener block of rigid material, preferably a high modulus plastic such as liquid crystal polymer is fastened to one side of a circuit board using a plurality of sets of integral flexible fingers. The fingers have arcuate protrusions formed thereon, which can underlie a surface of the board and thereby attach the stiffener block thereto. Each of the sets of the fingers surround a cylindrical opening that provides a relief area into which the fingers can flex as they pass through the throughbores in the circuit board. Each of the flexible fingers preferably has a plurality of arcuate protrusions thereon so the stiffener can be used with a plurality of thicknesses of circuit boards. Once the flexible fingers have been inserted into the throughbores in the board, a rigid pin is inserted into the opening thereby maintaining the flexible fingers in an outwardly extended position where said arcuate protrusion underlies the circuit board. It is preferred that the pin be inserted into the opening in the same direction that the flexible fingers are inserted into the circuit board so that assembly can be effected from a single side of the board with access to the opposing side being unnecessary.

Both the stiffener itself and the installation technique are inexpensive. Furthermore, the stiffener is very effective at minimizing deflection of the board at all temperatures the board is likely to experience. Lastly, the stiffener can be easily removed and replaced should, for some reason, the stiffener become damaged or otherwise need replacement.

Other features, advantages and characteristics of the present invention will become apparent after a reading of the following detailed description.

BRIEF DESCRIPTION OF THE DRAWINGS

The preferred embodiments of the present invention are described in conjunction with the following figures in which like items bear like reference numerals and, in which.

DETAILED DESCRIPTION OF THE PREFERRED EMBODIMENTS

Figure 1:
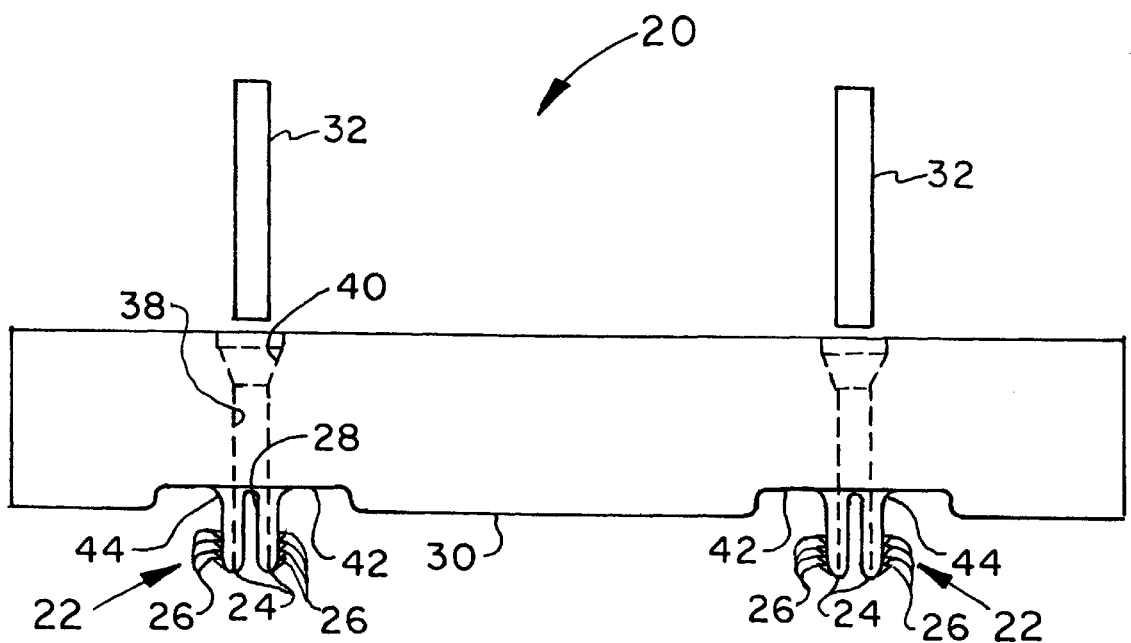
FIG. 1 is an exploded side view of the first embodiment of the board stiffener of the present invention.
Figure 3:
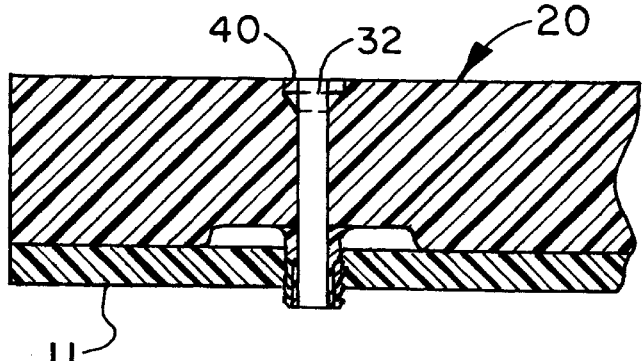
FIG. 3 is a partial side view in cross section of the first embodiment shown installed.
Figure 2:
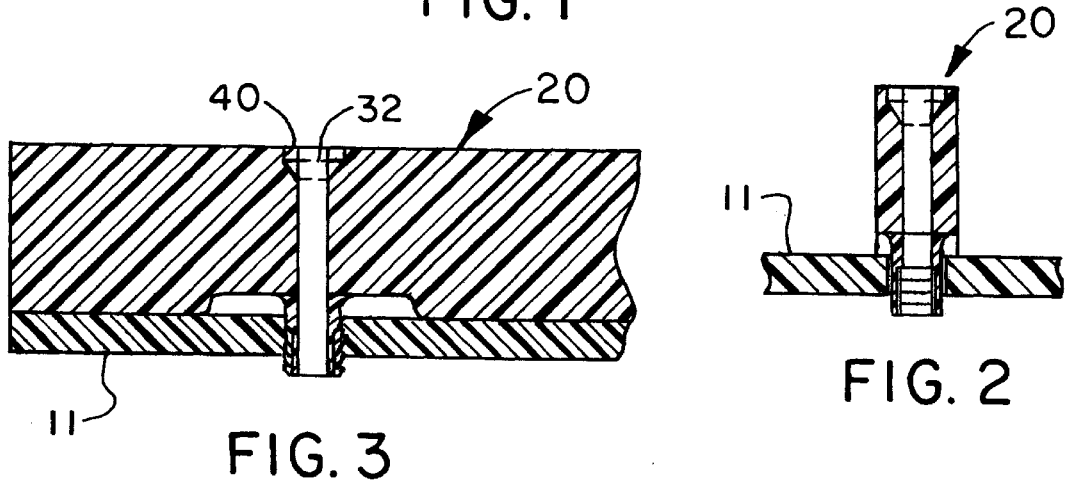
FIG. 2 is a cross-sectional end view of the first embodiment shown installed in a circuit board.

A first embodiment of the circuit board stiffener of the present invention is shown in FIGS. 1–3 generally at 20. Stiffener 20 comprises a generally rectangular block or bar of material. The block will preferably have a height at least twice its thickness and more preferably, on the order of three times its thickness. While other materials may be used, stiffener 20 is preferably made of a high modulus plastic and, most preferably, from liquid crystal polymer (LCP). Integral with an edge of block 20, are a plurality of flexible fingers 24. While two sets 22 are shown, three, four or more sets of fingers 24 could be used depending on the length of stiffener 20. Typically, stiffener 20 may range from 4 inches to 13 inches in length, or longer. Further, while the sets 22 are depicted, as having two fingers 24 each, sets could comprise three or more fingers. A minimum of two sets 22 of fingers 24 is preferred for alignment purposes. However, a single set of fingers 24 could be used if one or more projections (not shown) from the edge of stiffener 20 were to be received in alignment recesses in board 11.

Each finger 24 has at least one arcuate protrusion 26. More preferably, each finger 24 has a plurality of arcuate protrusions 26 so that stiffener 20 can be used with a plurality of thicknesses of circuit boards 11. Typically, circuit boards 11 may have thicknesses between 0.093 and 0.125 inches. By providing fingers 24 with a plurality of protrusions 26, a single design of board stiffener 20 can be used with several board thicknesses making it unnecessary to maintain inventories of various stiffener designs.

Flexible fingers 24 of each set 22 surround a central opening 28. Opening 28 provides a clearance space into which fingers 24 can flex from a first outwardly expanded position to a second contracted position as fingers 24 traverse throughbore 13 in board 11. When stiffener surface 30 is flush against board 11, the appropriate arcuate protrusion 26 will underlie board 11. Rigid pin 32 can then be inserted into central opening 28 to keep fingers 24 in the outwardly expanded position so that the appropriate protrusion 26 underlies board 11 and fingers 24 cannot be withdrawn from throughbore 13. Pins 32 will typically be pre-installed in second opening 38 that is in alignment with central opening 28. Pins 32 have a diameter that provides an interference fit with openings 28 and 38, and a length equal to the combined lengths of central (28) and second (38) openings. Hence, in their pre-installed position, a portion of pin 32 generally equal to the length of the central opening 38 (i.e., the length of flexible fingers 24) will extend above the upper edge of stiffener 20. To complete the assembly of the stiffener to the board 11 pin 32 is moved axially in openings 28, 38 to where rigid pin 32 lies behind flexible fingers 24 and prevents their inward movement so stiffener 20 remains attached to circuit board 11.

Mouth portion 40 of second opening 38 is flared to facilitate insertion of pin 32 and, if necessary, removal thereof. Flared mouth 40 is wide enough to permit the insertion of needle-nose pliers to permit removal of pin 32 from the upper surface, should the bottom surface be inaccessible. Alternatively, a dowel can be inserted into the bottom of central opening 28 and pin 32 tapped back into second opening 38 permitting fingers 24 to be flexed inwardly and withdrawn from throughbore 13. A relief recess 42 surrounds each set 22 of flexible fingers 24 and provides a stress relief radius 44 at the point the fingers 24 meet the bottom of recess 42. This reduces the likelihood that a stress fracture will occur which could result in the fingers 24 losing their resiliency or breaking off. Additional recesses or clearance apertures can be provided as a particular board design may require to accommodate various circuitry.

Tests were performed on stiffeners made in accordance with the present invention of the preferred material, glass filled LCP. The specimens were tested to failure at three temperatures: 72° F., 150° F., 300° F. The first specimen having a thickness of 0.123" and a height of 0.250" (i.e., a height more than double its thickness) had moduli of $0.998 \times 10^6$ psi, $0.930 \times 10^6$ psi, and $0.895 \times 10^6$ at the temperatures specified. A second specimen having a thickness of 0.122" and a height of 0.375" (i.e., a height to thickness ratio exceeding 3), had moduli of $2.037 \times 10^6$ psi, $1.584 \times 10^6$ psi and $1.161 \times 10^6$ psi at those same temperatures. Calculations for 5", 8" and 13" long reinforcement bars having thicknesses of 0.125" and various heights to determine maximum deflection at the center of the bar showed the following.

| 5" Stiffener Bar Max. Deflection in Inches | | | |
| --- | --- | --- | --- |
| Length | 72° F. | 150° F. | 300° F. |
| .375 | .012 | .015 | .020 |
| .400 | .010 | .012 | .016 |
| .450 | .007 | .009 | .012 |
| .500 | .005 | .006 | .009 |

Similar calculations for an 8" stiffener bar are tabulated below.

| 8" Stiffener Bar Max. Deflection in Inches | | | |
| --- | --- | --- | --- |
| Length | 72° F. | 150° F. | 300° F. |
| .375 | .048 | .061 | .083 |
| .400 | .040 | .051 | .069 |
| .450 | .028 | .035 | .048 |
| .500 | .020 | .026 | .035 |

Finally, calculations for a 13" stiffener bar appear in the following table.

| 13" Stiffener Bar Max. Deflection in Inches | | | |
| --- | --- | --- | --- |
| Length | 72° F. | 150° F. | 300° F. |
| .375 | .204 | .262 | .357 |
| .400 | .170 | .218 | .298 |
| .450 | .118 | .151 | .207 |
| .500 | .086 | .111 | .151 |

These calculations should reasonably predict the behavior of the stiffener bar 20 alone. When fastened to the circuit board, actual deflections should be on the order of only half the calculated deflections, perhaps even less.

Figure 4:
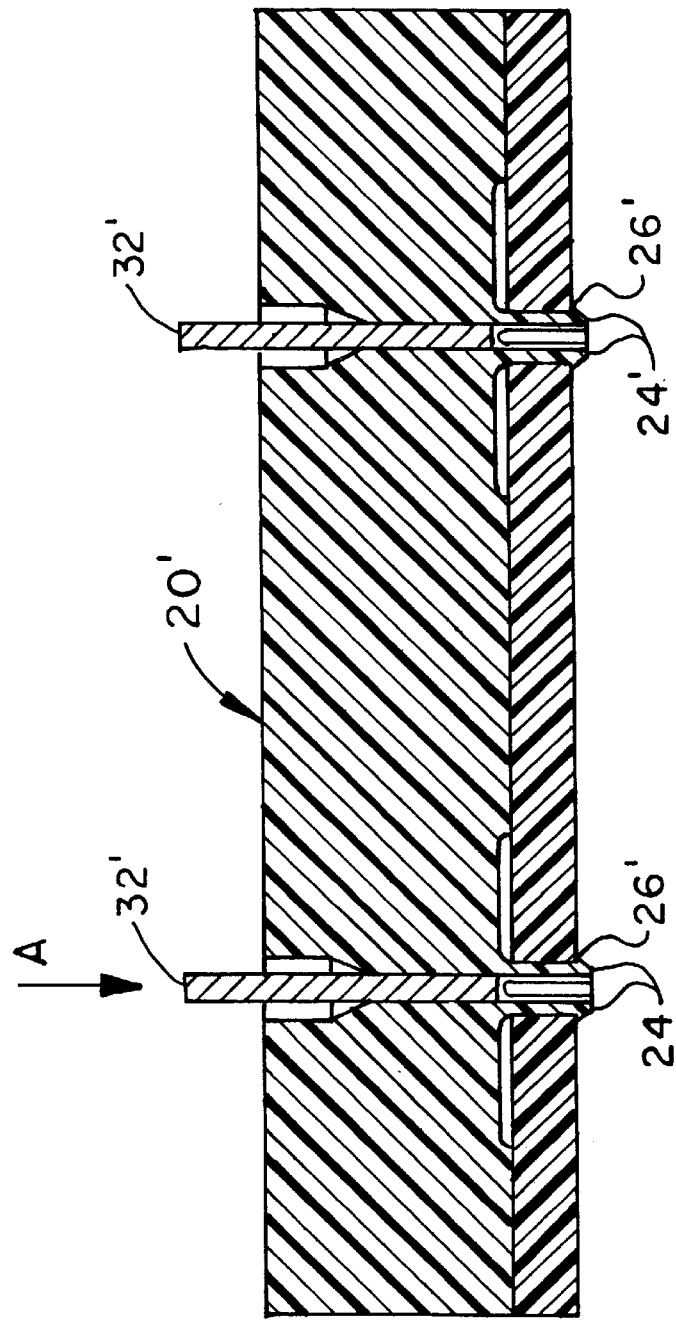
FIG. 4 is a cross-sectional side view of a second embodiment of the board stiffener of the present invention installed.
Figure 5:
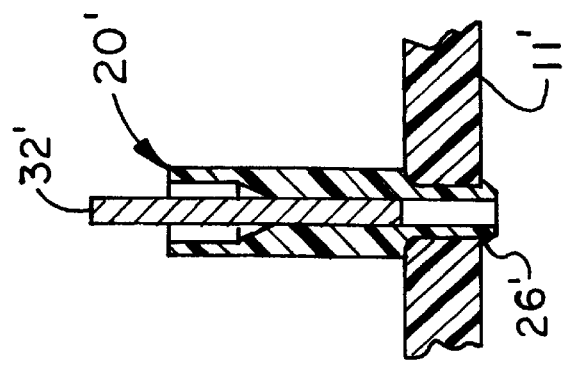
FIG. 5 is a cross-sectional end view of the second embodiment installed.

A second embodiment is shown in FIGS. 4 and 5 generally at 20'. In this embodiment, flexible fingers 24' have only a single protrusion 26'. As can be seen in FIG. 5, protrusion 26' can extend around the circumference of finger 24' than in the first embodiment. If a manufacturer has only a single thickness of board 11 with which it works, it may prefer a stiffener 20' made specifically for that thickness to one that can handle multiple thicknesses. Pins 32' are shown in their pre-installed positions in second openings 38'. Now that protrusion 26' underlies board 11', pins 32' can be slid axially in their openings in the direction of arrow A to back up flexible fingers 24' and prevent their retraction from throughbores 13' thereby locking stiffener 20' to board 11'.

The present invention provides a circuit board stiffener 20 that is relatively inexpensive, highly effective and easy to install. In addition to the cost savings realizable through manufacturing and installation, the throughbores in the circuit board 11 need not be plated as is necessary with some other stiffeners to provide insulation since the flexible fingers 24 serve this purpose.

Various changes, alternatives and modifications will become apparent after a reading of the foregoing detailed description. For example, although only a single size of finger 24 has been shown for uniformly sized throughbores 13 in boards 11, it is considered within the scope of the invention to include several diameters of fingers 24 for insertion in different sized holes 13. It is intended that all such changes, alternatives and modifications as fall within the scope of the following claims be considered part of the present invention.

We claim:
1. A circuit board stiffener comprising:
   a) a generally rectangular block of rigid material having a height at least twice its thickness;
   b) a plurality of integral flexible fasteners formed along an edge portion of said block of rigid material, each said flexible fastener having an interrupted annular configuration and including at least two flexible fingers, each said flexible finger having at least one arcuate protrusion formed there on, each said at least two flexible fingers surrounding a central opening, said central opening providing clearance space to permit said fingers to flex from a first outwardly expanded position to a second inwardly contracted position;
   c) a rigid pin received in said central opening to maintain said fingers in said outwardly expanded position;
   whereby when said flexible fastening fingers are inserted into throughbores in the circuit board said fingers will flex inwardly into said central opening to said second position during insertion, returning to said first outwardly expanded position when insertion is complete allowing at least one of said arcuate protrusions on each of said fingers to underlie a bottom portion of the circuit board and, subsequently, said rigid pin will be slid into said central opening to maintain said flexible fastening fingers in said first outwardly expanded position whereby said circuit board stiffener is secured to the circuit board.

2. The circuit board stiffener of claim 1 wherein said plurality of flexible fasteners comprise at least two sets of said at least two fingers, each set surrounding its own central opening.

3. The circuit board stiffener of claim 2 wherein each of said plurality of sets of at least two flexible fastening fingers comprises a pair of flexible fingers.

4. The circuit board stiffener of claim 1 wherein each of said flexible fastening fingers has a plurality of arcuate protrusions formed along its axial length, each arcuate protrusion accommodating one of several different thicknesses of circuit boards.

5. The circuit board stiffener of claim 1 further comprising a series of second openings in said circuit board stiffener, one each positioned above each of said central openings in axial alignment therewith to define one of said throughbores.

6. The circuit board stiffener of claim 5 wherein said rigid pin is metal and initially positioned in said second opening and, when said pin is axially slid into said central opening to lock said circuit board stiffener to the circuit board, it remains isolated from contact therewith.

7. The circuit board stiffener of claim 6 wherein said rigid pin is comprised of steel.

8. The circuit board stiffener of claim 6 wherein each of said rigid pins has a smooth outer surface which forms an interference fit with its respective said central opening and said second opening to maintain said rigid pin in a desired axial position therein.

9. The circuit board stiffener of claim 8 wherein said rigid pin has a length generally equal to a combined length of said central opening and said second opening.

10. The circuit board stiffener of claim 9 wherein said rigid pin is inserted on an edge portion opposite said edge portion from which said integral flexible fastening fingers are formed whereby attachment of said board stiffener requires access to only a single side of said circuit board.

11. The circuit board stiffener of claim 1 wherein each said flexible fastener has a relief recess adjacent thereto in which a stress relief radius is formed with an adjacent surface portion of said circuit board stiffener.

12. The circuit board stiffener of claim 1 wherein said rigid material from which said stiffener is made comprises a high modulus plastic.

13. The circuit board stiffener of claim 12 wherein said plastic is most preferably glass filled liquid polymer crystal.

14. A method of removably attaching a stiffener bar to a circuit board, said method including the steps of
   a) inserting at least two flexible fasteners integral with an edge portion of said stiffener bar into throughbores in the circuit board from a first side of said circuit board, each of said fasteners including a set of at least two fingers with each finger having an arcuate protrusion which will underlie a portion of the circuit board after insertion;
   b) placing a rigid, smooth surfaced metallic pin in an annular opening in said stiffener bar from the same side of the circuit board through which said flexible fingers are inserted, said opening extending through said stiffener bar between said flexible fingers;
   c) moving said rigid, smooth surfaced metallic pin axially within said opening to a position where said rigid pin is positioned behind each of said at least two flexible fingers and maintains each said flexible finger in an outwardly flexed position where said arcuate protrusions underlie the circuit board thereby securing said stiffener bar to said board and where said smooth surfaced metallic pin remains isolated from contact with the circuit board.

15. The method of claim 14 wherein said smooth surfaced metallic pin is moved in the same direction as said flexible fingers are inserted into said circuit board during the attachment step.

16. The method of claim 14 wherein said stiffener bar may be removed from said circuit board by d) axially moving said rigid, smooth surfaced metallic pin to a position where it is not positioned behind each of said flexible fingers, and e) flexing said flexible fingers inwardly and axially removing said fingers from said axial throughbores in said circuit board.

17. The method of claim 16 wherein step d) is performed by moving said rigid, smooth surfaced metallic pin in a direction opposite to the direction in which said fingers are inserted in said circuit board during the attachment step.

* * * * *